US006888146B1

(12) United States Patent
Leung et al.

(10) Patent No.: US 6,888,146 B1
(45) Date of Patent: May 3, 2005

(54) MASKLESS MICRO-ION-BEAM REDUCTION LITHOGRAPHY SYSTEM

(75) Inventors: Ka-Ngo Leung, Hercules, CA (US); William A. Barletta, Oakland, CA (US); David O. Patterson, Annandale, VA (US); Richard A. Gough, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/289,332

(22) Filed: Apr. 9, 1999

Related U.S. Application Data (60) Provisional application No. 60/081,366, filed on Apr. 10, 1998.

(51) Int. Cl.[7] .................................................. H01J 3/18
(52) U.S. Cl. ................. 250/398; 250/492.3; 250/493.1; 250/396 R; 250/492.1; 250/423 R
(58) Field of Search ................................ 250/491, 492, 250/396 R, 398, 423 R; 156/62

(56) References Cited

U.S. PATENT DOCUMENTS

| | | | | | |
|---|---|---|---|---|---|
| 4,457,803 A | * | 7/1984 | Takigawa | .................... | 156/626 |
| 4,524,278 A | * | 6/1985 | Le Poole | .................... | 250/398 |
| 4,739,169 A | * | 4/1988 | Kurosawa et al. | .......... | 250/423 |
| 4,757,208 A | * | 7/1988 | McKenna et al. | ........ | 250/492.2 |
| 4,798,959 A | * | 1/1989 | Marks | ...................... | 250/492.2 |
| 5,365,070 A | * | 11/1994 | Anderson et al. | ........ | 250/423 R |
| 5,558,718 A | * | 9/1996 | Leung | .......................... | 118/723 |
| 5,583,344 A | * | 12/1996 | Mizumura et al. | ..... | 250/492.21 |
| 5,637,951 A | * | 6/1997 | Parker | ......................... | 313/336 |
| 5,674,351 A | * | 10/1997 | Lovoi | ...................... | 156/629.1 |
| 5,945,677 A | * | 8/1999 | Leung et al. | ........... | 250/396 R |
| 6,064,807 A | * | 5/2000 | Arai et al. | ..................... | 716/21 |
| 6,157,039 A | * | 12/2000 | Mankos | .................... | 250/492.2 |
| 6,486,480 B1 | * | 11/2002 | Leung et al. | .......... | 250/492.21 |
| 6,498,348 B2 | * | 12/2002 | Aitken | ................ | 250/396 ML |
| 6,677,598 B1 | * | 1/2004 | Benveniste | ............ | 250/492.21 |
| 6,797,969 B2 | * | 9/2004 | Gerlach et al. | ........... | 250/492.3 |
| 2002/0043621 A1 | * | 4/2002 | Aitken | ........................ | 250/281 |
| 2003/0209676 A1 | * | 11/2003 | Loschner et al. | ........ | 250/492.2 |

OTHER PUBLICATIONS

Lomer, P.D.;Bounden, J.E.; Wood, J.D.L.H., "High Output Neutron Generating Tubes," CONF–650405–2, Services Electronics Rsrch Lab (Baldock, England), p. 623–34, (Sep. 1, 1964).*

Eyrich, W.; Schmidt, A., "Two Compact, High –Intensity Pulsed Neutron Sources," Tehnical Report No. KFK–304; SM–62/4, Federal Republic of Germany (Germany), p. 589–608, (May 1, 1965).*

Lomer, P.D.; Bounden, J.E.; Wood, J.D.L.H., "A Neutron Tube with Constant Output," Nucl. Instr. Methods, Services Electronics Resrch Lab (Baldock, England), p. 283–288, (Mar. 1, 1965).*

* cited by examiner

*Primary Examiner*—John R. Lee
*Assistant Examiner*—David A. Vanore
(74) *Attorney, Agent, or Firm*—Henry P. Sartorio; Joseph R. Milner

(57) ABSTRACT

A maskless micro-ion-beam reduction lithography system is a system for projecting patterns onto a resist layer on a wafer with feature size down to below 100 nm. The MMRL system operates without a stencil mask. The patterns are generated by switching beamlets on and off from a two electrode blanking system or pattern generator. The pattern generator controllably extracts the beamlet pattern from an ion source and is followed by a beam reduction and acceleration column.

20 Claims, 11 Drawing Sheets

FIG. 8

MASKLESS MICRO-ION-BEAM REDUCTION LITHOGRAPHY SYSTEM

RELATED APPLICATIONS

This application claims priority of Provisional Application Ser. No. 60/081,366 filed Apr. 10, 1998.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates generally to ion beam lithography and more particularly to ion beam lithography systems without stencil masks.

As the dimensions of semiconductor devices are scaled down in order to achieve ever higher levels of integration, optical lithography will no longer be sufficient for the needs of the semiconductor industry, e.g. DRAM and microprocessor manufacture. Alternative "nanolithography" techniques will be required to realize minimum feature sizes of 0.1 $\mu$m or less. In addition, the next generation lithography technologies must deliver high production throughput with low cost per wafer. Therefore, efforts have been intensified worldwide in recent years to adapt established techniques such as X-ray lithography, extreme ultraviolet lithography (EUVL), electron-beam (e-beam) lithography, and ion projection lithography (IPL), to the manufacture of 0.1 $\mu$m-generation complementary metal-oxide-semiconductor (CMOS) technology. Significant challenges exist today for each of these techniques. In particular, there are issues with complicated mask technology.

Figure 1A:
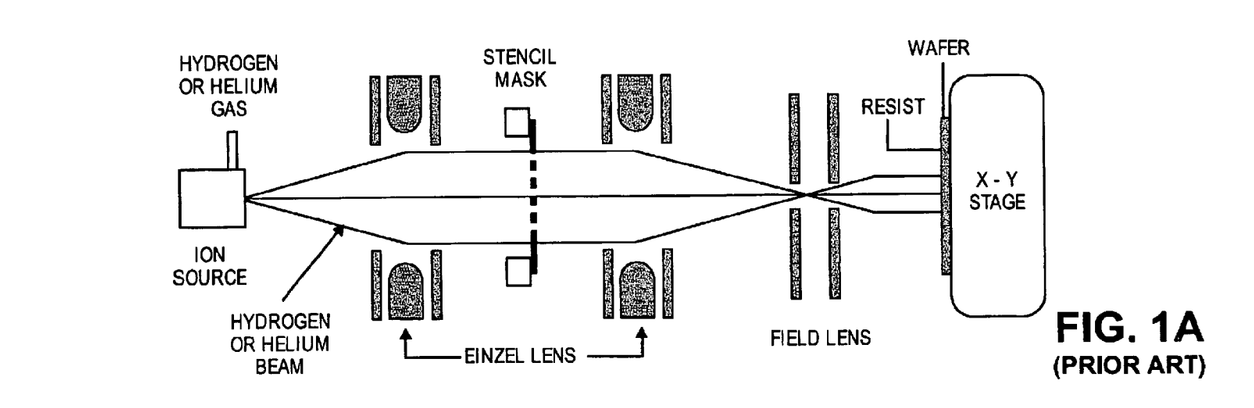
FIGS. 1A, B illustrate a prior art IPL system and a plasma formed IPL system.

Conventional ion projection lithography (IPL) systems, as shown in FIG. 1A, require many stencil masks for semiconductor circuit processing. An ion source with low energy spread is needed to reduce chromatic aberration. A small beam extracted from the source is accelerated and expanded to form a parallel beam before impinging onto a large area stencil mask which contains many small apertures. The aperture pattern is then projected onto a resist layer on a wafer after the beam is reduced in size and made parallel by an Einzel lens system. Different masks with particular patterns must be used for each layer to be formed on the wafer.

Figure 2A:
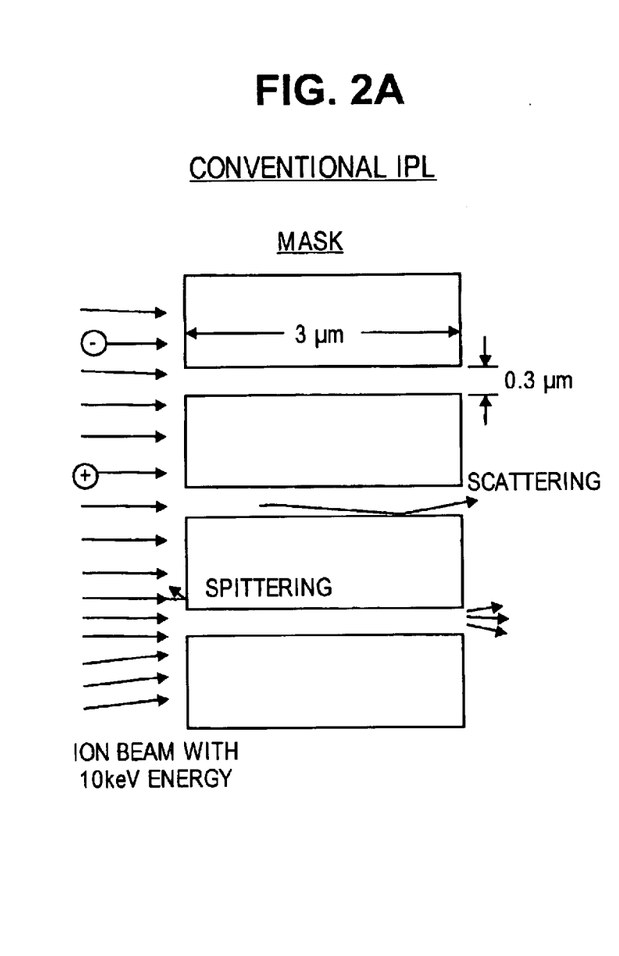
FIGS. 2A, B illustrate the stencil masks of the IPL systems of FIGS. 1A, B.

In the conventional IPL setup, the stencil mask, shown in FIG. 2A, is extremely thin, e.g. about 3 $\mu$m, to minimize beam scattering inside the aperture channels. Since the beam energy is high, about 10 keV, when it arrives at the mask, both sputtering and mask heating will occur, causing unwanted mask distortion and instability.

Figure 1B:
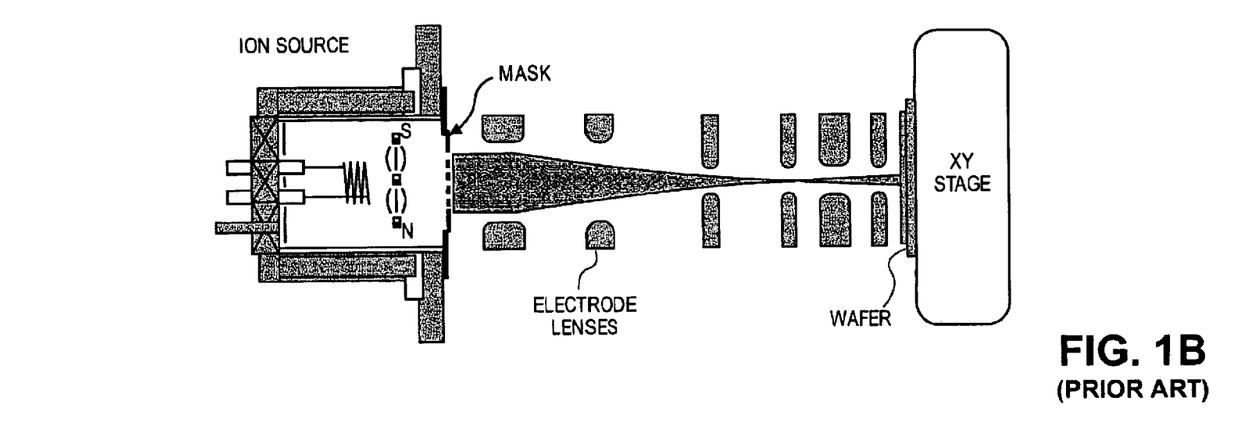
Figure 2B:
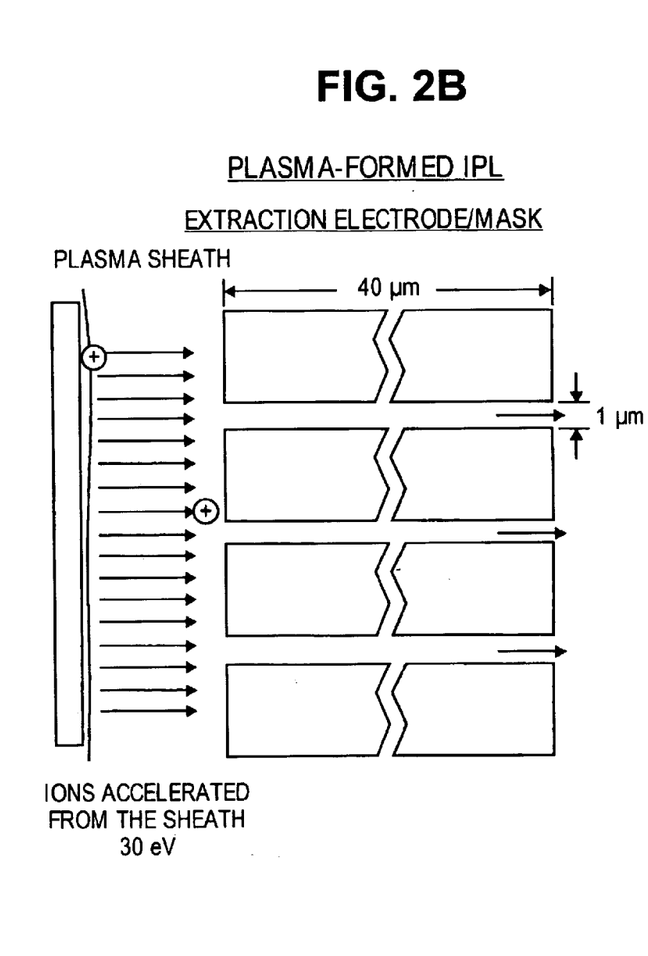

An alternative IPL system, the plasma-formed IPL system, as shown in FIG. 1B, and described in copending application Ser. No. 09/289,333 filed herewith, which is herein incorporated by reference, eliminates the acceleration stage between the ion source and stencil mask. Instead a much thicker and more stable mask is used as a beam forming electrode, positioned next to the plasma in the ion source. The extracted beam passes through an acceleration and reduction stage onto the resist coated wafer. Because low energy ions, about 30 eV, pass through the mask, as shown in FIG. 2B, heating, scattering, and sputtering are minimized. However, a separate mask is needed for each new feature pattern to be projected onto the wafer.

SUMMARY OF THE INVENTION

Accordingly it is an object of the invention to provide an ion projection lithography (IPL) system which has no stencil mask.

It is also an object of the invention to provide an IPL system which can generate a variety of different beam patterns using a single apparatus.

The invention is a maskless micro-ion-beam reduction lithography (MMRL) system which produces feature sizes down to 0.1 $\mu$m or less. The MMRL system operates without a stencil mask. The patterns are generated by switching beamlets on or off using a universal pattern generator which is positioned as the extraction electrode of the plasma source. The pattern generator is a two electrode blanking system. A multicusp ion source with magnetic filter produces ion beams with low energy spread, as low as 0.6 eV. The low energy plasma ions are selectively passed through the pattern generator by applying suitable voltages to the electrodes to produce the desired pattern. A beam accelerator and reduction column after the pattern generator produces a demagnified pattern on the resist.

DETAILED DESCRIPTION OF THE INVENTION

Figure 3:
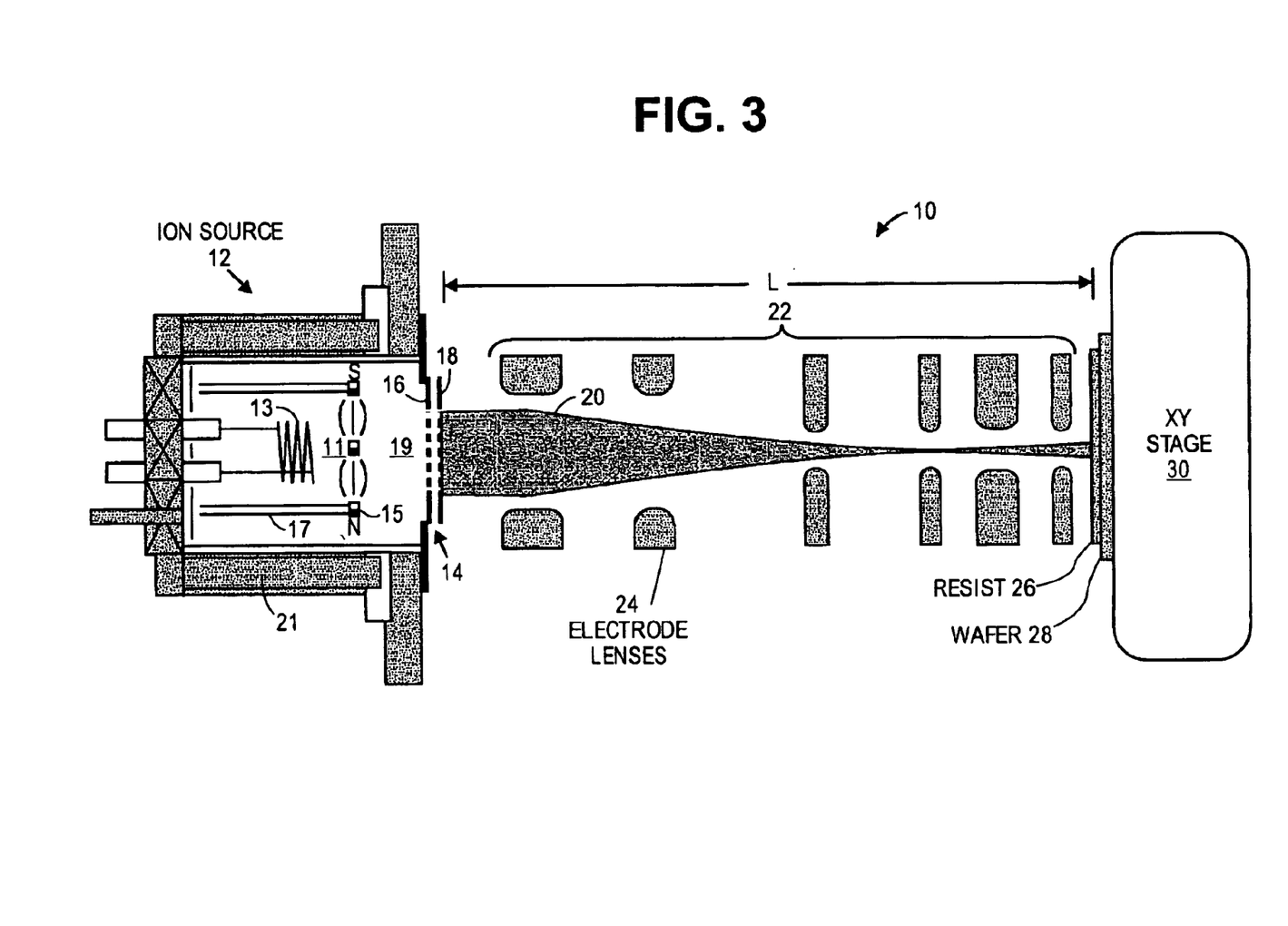
FIG. 3 shows an MMRL system according to the invention.

A maskless micro-ion-beam reduction lithography (MMRL) system 10, shown in FIG. 3, has an ion source 12 with a pattern generator 14 formed of a pair of electrodes 16, 18 positioned to form a multi-beamlet ion beam 20. The extracted beam 20 passes through an acceleration and reduction column 22, of length L, formed of a plurality of electrode lenses 24. Column 22 reduces the micro-beamlet pattern produced by pattern generator 14 by factors greater than 5 to achieve feature sizes less than 100 nm. The beam from column 22 is incident on a resist layer 26 on a wafer 28 which is mounted on a mechanical stage or support 30. The wafer 28 with exposed resist layer 26 is processed by conventional techniques.

The MMRL system 10 is made up of the following major components:

A. Ion Source—Multicusp Plasma Generator

As shown in FIG. 3, ions are produced in a plasma generation region 11 of an ion source 12 which may be of conventional design. Plasma is generated by an RF antenna 13 or alternatively by a filament. A linear magnetic filter 15 or a coaxial magnetic filter 17 is used to decrease energy spread of the ions. The plasma ions pass to extraction region 19 of source 12. Conventional multicusp ion sources are illustrated by U.S. Pat. Nos. 4,793,961; 4,447,732; 5,198,677, which are herein incorporated by reference. Copending application Ser. No. 09/187,540 filed Nov. 6, 1998, now U.S. Pat. No. 6,094,012 issued Jul. 25, 2000, which is herein incorporated by reference, describes a preferred ion source with a coaxial magnetic filter which has a very low energy spread.

The multicusp plasma generator provides positive ions needed for resist exposure. Normally either hydrogen or helium ions are used for this purpose. The external surface of ion source 12 is surrounded by columns of permanent magnets 21 which form multicusp fields for primary ionizing electron and plasma confinement. The cusp fields are localized near the source wall, leaving a large portion of the source free of magnetic fields. As a result, this type of ion source can generate large volumes of uniform and quiescent plasmas having relatively flat radial density profiles. For example, a 30 cm diameter chamber can be used to form a uniform plasma volume of about 18 cm diameter. Larger uniform plasmas can be generated by using bigger source chambers with well designed permanent magnet configurations.

The plasma of the multicusp source can be produced by either radio-frequency (RF) induction discharge or by dc filament discharge. However for MMRL, an RF driven discharge is preferred since the quartz antenna coil typically used for antenna 13 will not generate impurities and there is no radiation heating of the first electrode of column 22 due to hot tungsten filament cathodes. The discharge plasma will be formed in short pulses, e.g. about 300 ms pulse length, with high or low repetition rates. With a magnetic filter in the source, the axial ion energy spread can be reduced to values below 1 eV. The output current density is high, e.g. greater than 250 mA/cm2, for pulsed operation and the source can produce ion beams of nearly any element.

B. Pattern Generator—Multibeamlet Extraction System

The open end of ion source 12 is enclosed by pattern generator 14 which forms a multibeamlet extraction system. Pattern generator 14 is formed of a spaced pair of electrodes 16, 18 and electrostatically controls the passage of each individual beamlet to form a predetermined beamlet pattern to be projected.

Figure 4A:
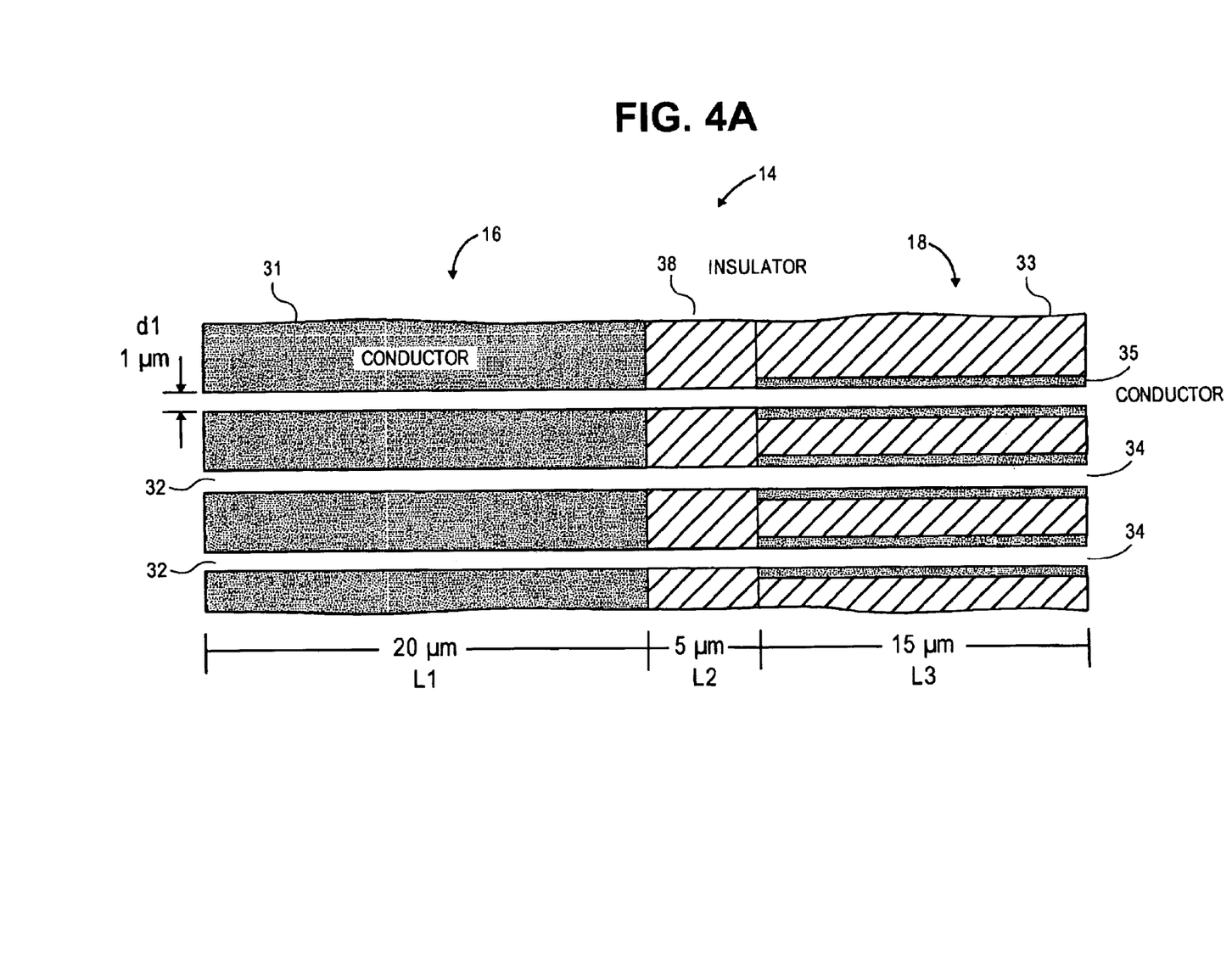
FIGS. 4A, B are sectional and perspective views of a two electrode pattern generator for the MMRL system.
Figure 4B:
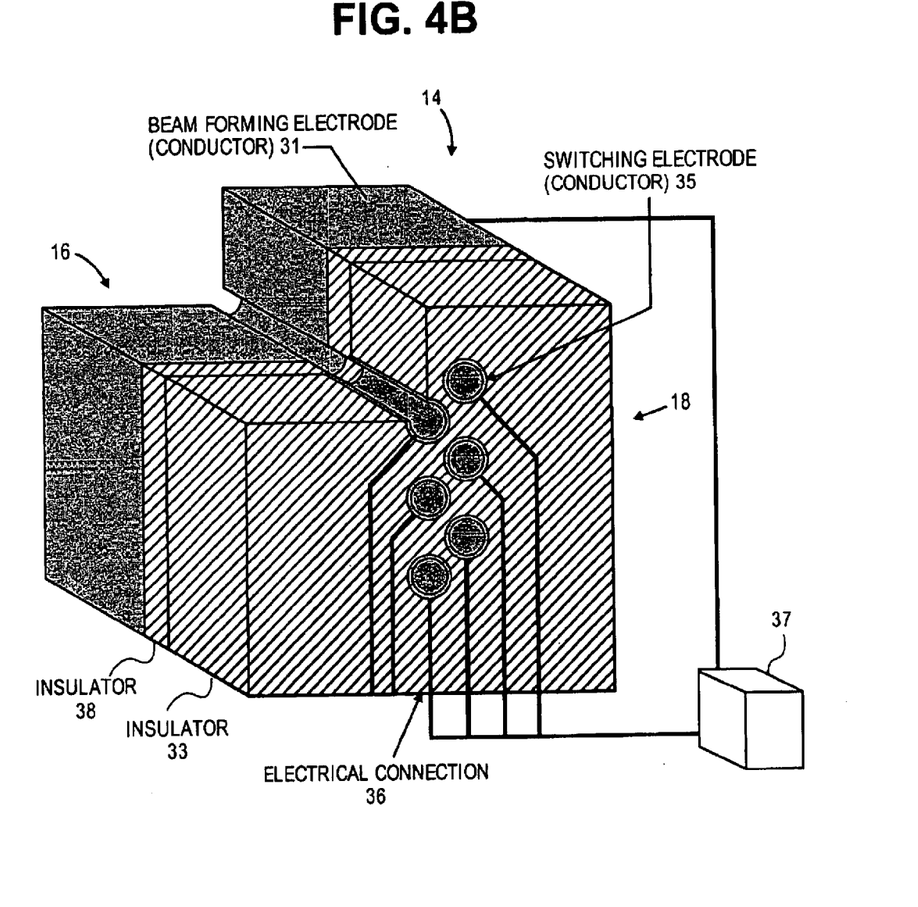

FIGS. 4A, B illustrate a preferred embodiment of a pattern generator—beamlet extractor 14. First electrode 16 is the plasma or beam forming electrode and is formed of a conductor 31 having a plurality of apertures or channels 32 formed therein. The apertures 32 on the extractor 14 will be arranged to fall within the uniform plasma density region of the source. Second electrode 18 is the extraction or beamlet switching electrode and is formed of an insulator 33 having a plurality of apertures or channels 34 formed therein. Each channel 34 contains an annular conductor 35 which is electrically connected by electrical connection 36 to a programmable voltage source 37 which can apply different voltages to each of the annular conductors 35. Conductor 31 is also connected to voltage source 37 or to a separate source. Electrodes 16, 18 are separated by an insulator 38. Channels 32, 34 are aligned with each other and extend through insulator 38. Conductor 31, insulator 38, and insulator 33 have thickness of L1, L2, L3 respectively. Typical values are L1=20 μm, L2=5 μm, and L3=15 μm, for a total thickness of about 40 μm which is much thicker than the thickness of a typical stencil mask. The diameter of the channels 32, 34 through the pattern generator 14 is d1, typically about 1 μm.

In operation, the first electrode is biased negatively, about 30 V, with respect to the ion source chamber wall. A very thin plasma sheath is formed parallel to the first electrode surface. Positive ions in the plasma will fall through the sheath and impinge perpendicular to the electrode with an energy of about 30 eV. Ions will enter the apertures of the first electrode forming multiple beamlets. With such low impact energies, sputtering of the electrode will not occur. In addition, the heating power generated by ions on the electrode is extremely small and will not produce any instability of the extraction system. Because of low incoming energy, ion scattering inside the aperture channels is minimized. The ions will be absorbed on the channel surfaces rather than forming aberrated beams as they leave the apertures.

In the second electrode, if the annular conductors surrounding each aperture channel are also biased at the same potential as the first electrode, then ions will leave the apertures with an energy of about 30 eV. However, if the annular conductors of the second electrode are biased positively with respect to the first electrode, then the flow of ions to the aperture exit will be impeded by the electrostatic field. If this bias voltage is high enough, then the beam output will essentially become zero, i.e. the beam is turned off. Since the voltage on each annular conductor of the second electrode can be independently controlled, each individual beamlet can independently be turned on and off. Thus any desired beamlet pattern can be produced by the pattern generator, and the pattern can easily be switched to a different pattern.

In this multibeamlet extraction system, circular apertures will typically be employed. There will be many apertures, e.g. each with a diameter of about 1 μm and a separation less than 100 nm. These circular patterns will be projected onto the resist on the wafer with a reduction factor of typically 20. The final image size of each beamlet will then be 50 nm with separation less than 5 nm. The material between the image dots will be made so small that they will disappear during the etching process.

Figure 5A:
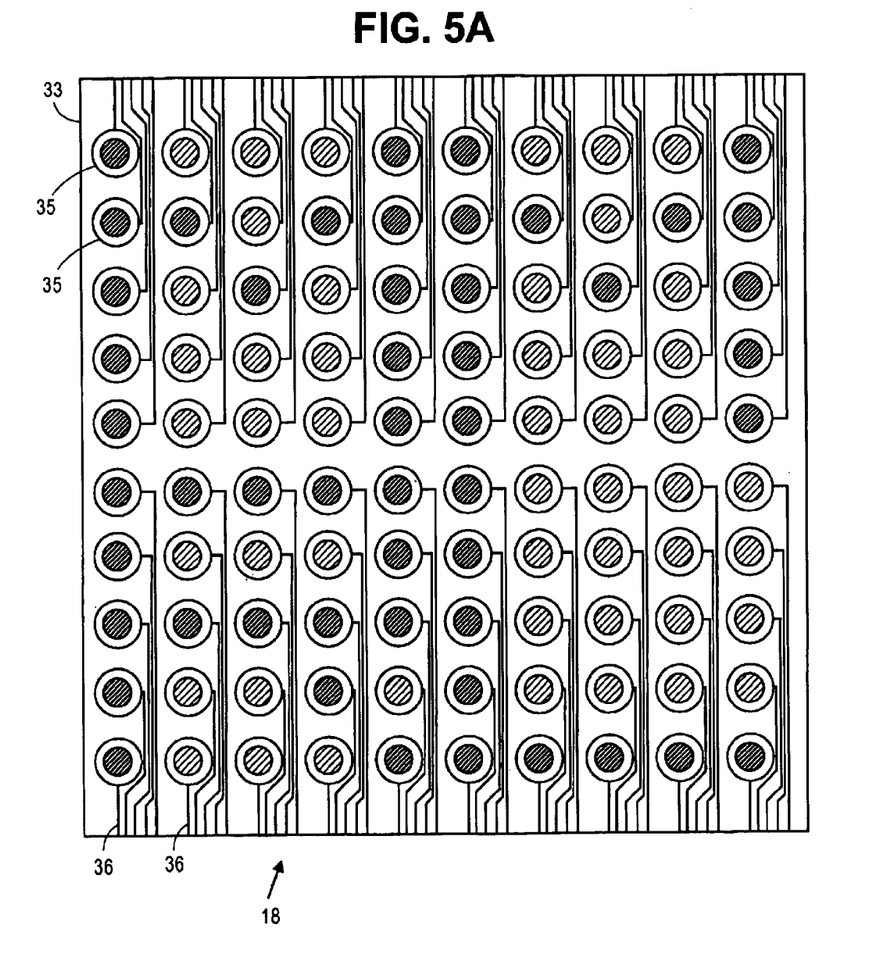
FIGS. 5A–C illustrate a dot matrix arrangement, a single column arrangement, and a double column arrangement of the apertures in the second electrode.
Figure 5B:
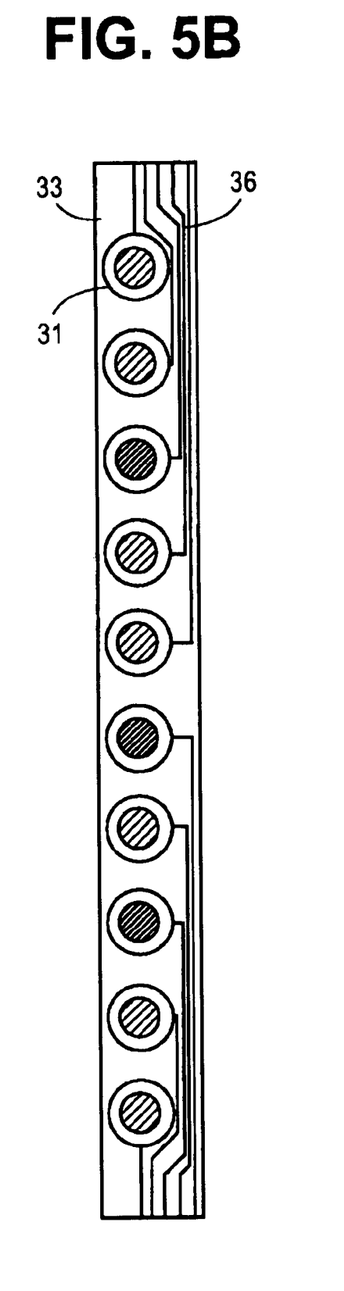
Figure 5C:
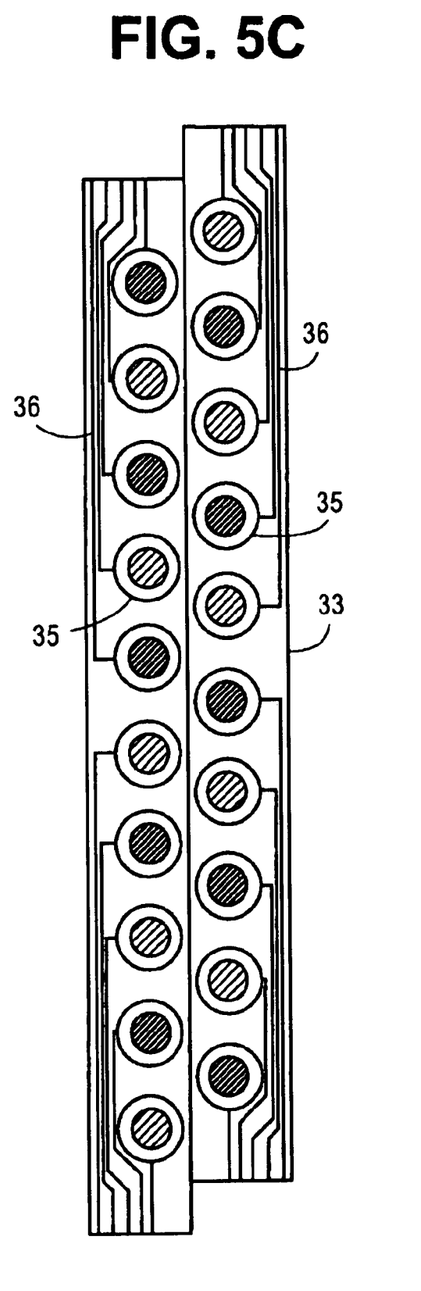

A large number of beamlets may be formed in a dot matrix arrangement as shown in FIG. 5A which illustrates a 10×10 beamlet array produced by the second electrode. The dark dots in the apertures represent a beam current coming out of the aperture while the light dots are apertures with no beam current. If the number of apertures is too large for fabrication, one can generate the desired pattern by combining beam reduction with dimensional scanning. Instead of a large N×N matrix, a single or double column of apertures as shown in FIGS. 5B, C can be used. The beamlets in these columns can be switched on and off while the entire beam is scanned over the wafer in one direction by electrostatic deflection. Instead of scanning the entire beam, one can keep the beam stationary while moving the wafer substrate mechanically in very fine steps.

C. Acceleration and Beam Reduction Column

Figure 6A:
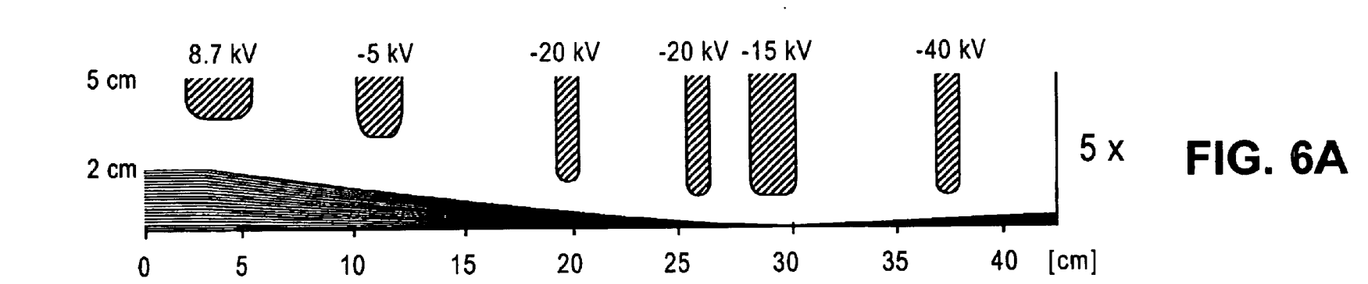
FIGS. 6A–F show acceleration and reduction columns with different demagnification factors.
Figure 6B:
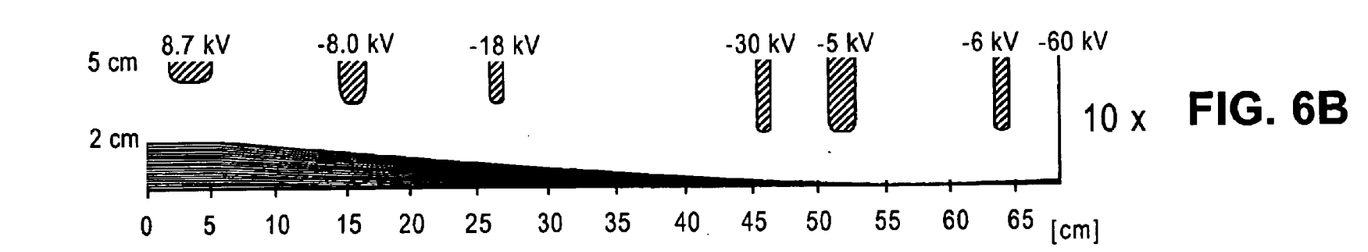
Figure 6C:
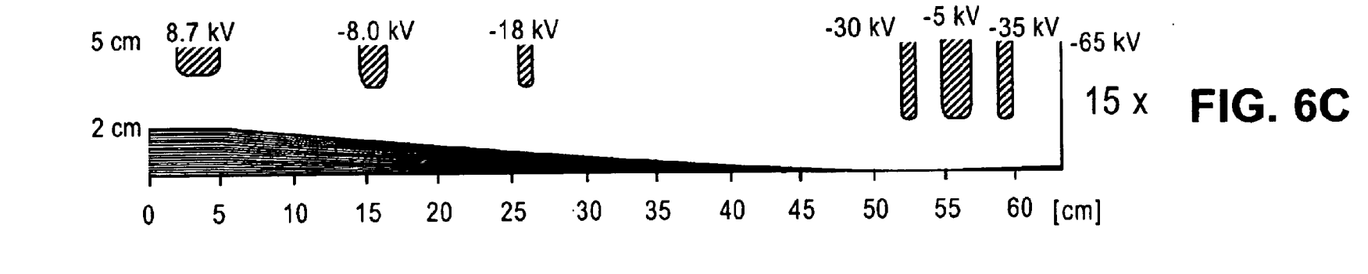
Figure 6D:
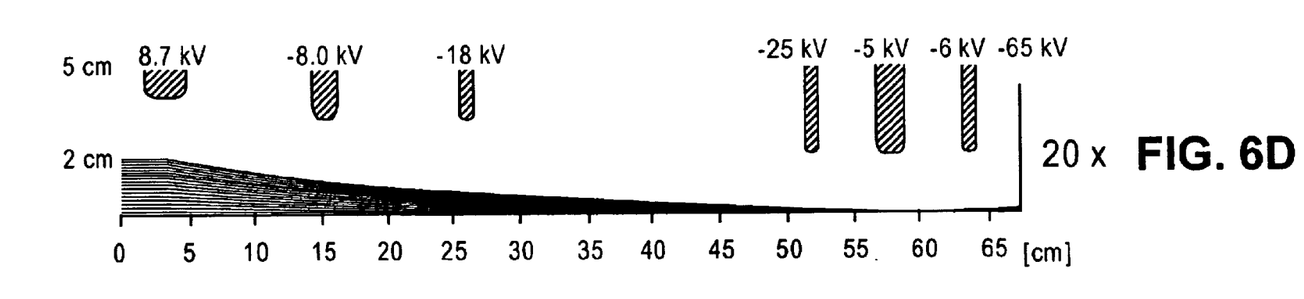
Figure 6E:
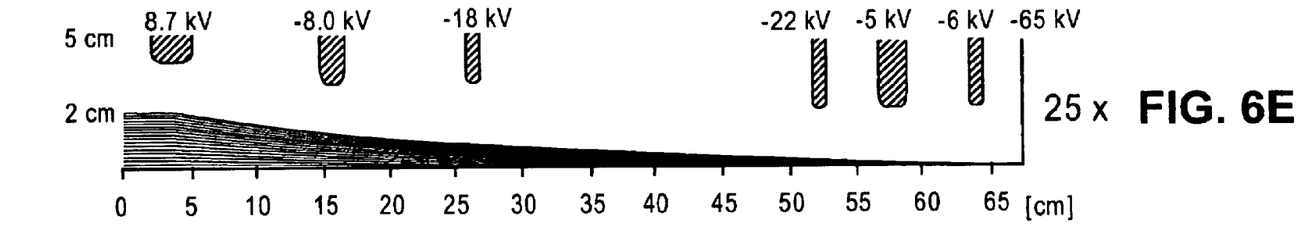
Figure 6F:
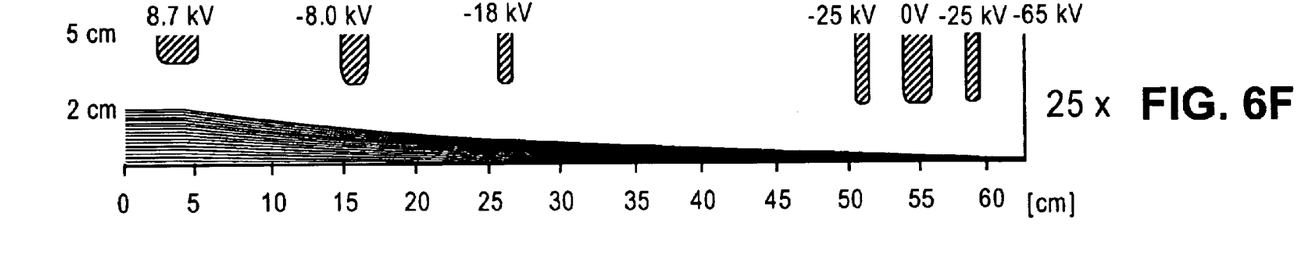

The micro-ion-beams leave the apertures of the extractor 14 with an energy of about 30 eV. They will be further accelerated and focussed by a simple all electrostatic acceleration and reduction column (lens system) 22 which is made up of a plurality of electrodes 24. The final parallel beam can be reduced to different sizes according to the particular lens design. FIGS. 6A–F illustrate lens systems with 5×, 10×, 15×, 20×, 25×, and 50×image reduction factors. For example, FIG. 6D shows a 20×image reduction system. The total length of this accelerator/reduction column is only about 65 cm, and other designs may be even shorter, e.g. about 35 cm. The beam reduction system can be designed with or without beam crossover, as described in copending application Ser. No. 09/289,333 filed herewith, which is herein incorporated by reference.

Figure 7:
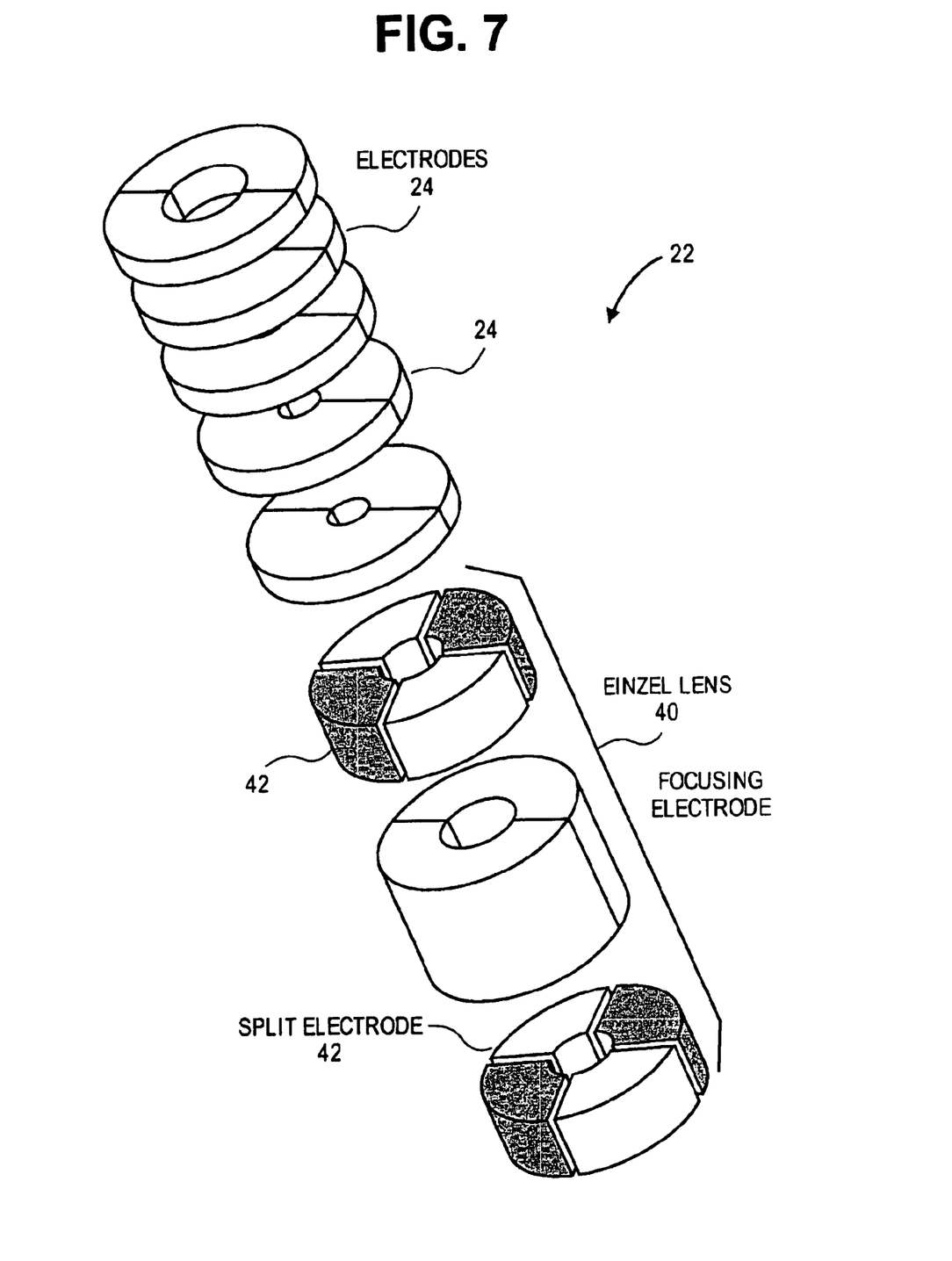
FIG. 7 shows the split electrodes of an Einzel lens of an acceleration and reduction lens column.

A portion of the acceleration and reduction column 22 may be made up of an Einzel lens system 40 which includes a pair of split electrodes 42, as shown in FIG. 7. The two Einzel electrodes 42 can be used to steer the beamlets by applying suitable voltages. This feature is important for circuit stitching purposes when the field of exposure is smaller than the chip size. By applying different voltages on the segments of the split electrodes 42, one can steer or scan the beam very fast, as fast as several cm in tens of nanoseconds, in the x or y direction.

Figure 8:
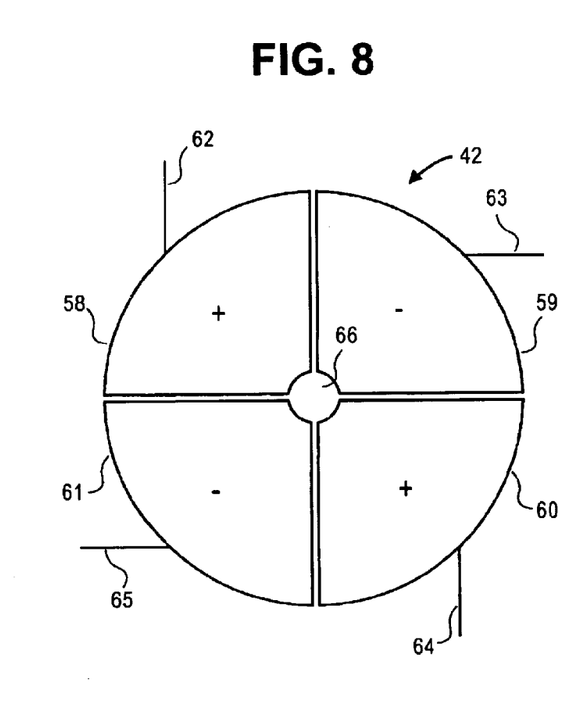
FIG. 8 shows the structure of a split electrode for an Einzel lens.

A split electrode 42, as shown in FIG. 8, which can be used in Einzel lens 40, is formed of four electrically isolated segments 58, 59, 60, 61. By applying voltages to the electrode segments through electrical connections 62, 63, 64, 65, a beam passing though central aperture 66 may be deflected or scanned, as well as focused.

Very compact acceleration/reduction columns are also included in a focused ion beam (FIB) system described in copending application Ser. No. 09/225,996 filed Jan. 5, 1999, now U.S. Pat. No. 5,945,677 issued Aug. 31, 1999, which is herein incorporated by reference. An ion beam produced by an ion source or plasma generator propagates through the FIB system to produce a focused output beam which has a spot size down to 1 $\mu$m or less and a current greater than 1 $\mu$A.

Figure 9:
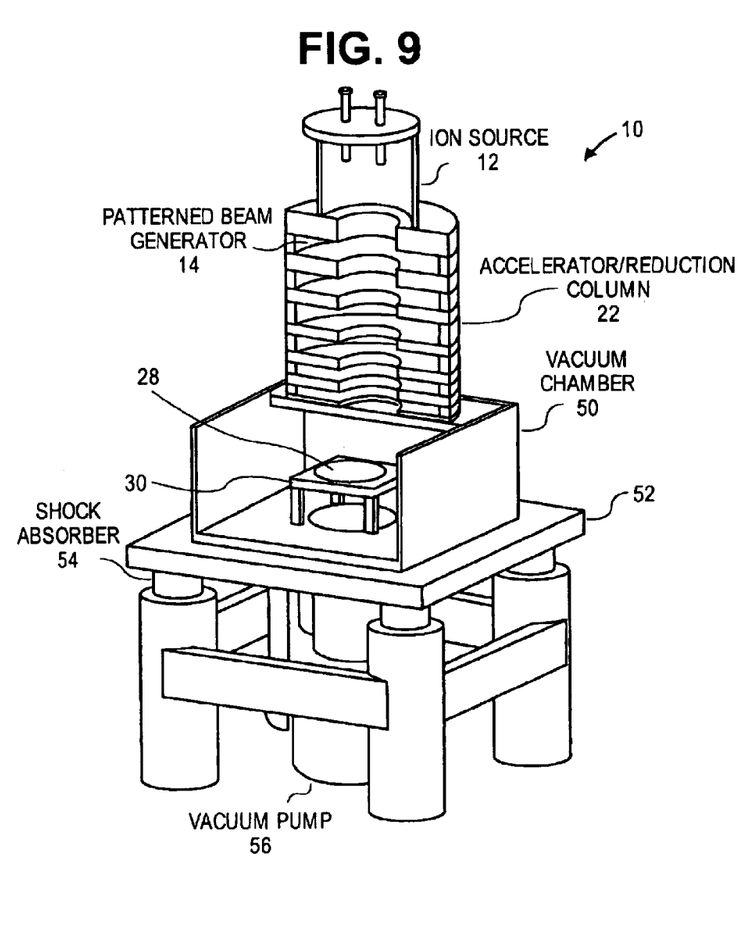
FIG. 9 is a perspective view, partly in section, of a maskless micro-ion-beam reduction lithography system of the present invention.

Using the above described components, a maskless micro-ion-beam reduction system 10 is illustrated conceptually in FIG. 9. An ion source 12 with a patterned beam generator 14 at its output end sits atop an accelerator/reduction column 22 which sits atop a vacuum chamber 50 which contains a wafer 28 mounted on a stage 30. Vacuum chamber 50 sits on a table 52 which is mounted on shock absorbers 54 for vibration isolation. A vacuum pump 56 communicates with the interior of vacuum chamber 50.

The MMRL system uses a pattern generator which electrostatically produces and manipulates, i.e. switches on and off, a plurality of micro-ion beamlets which are coupled to a beam reduction and acceleration column. Beam demagnification factors of up to 50 or more can be achieved with simple all-electrostatic accelerator columns. The system can provide economic and high throughput processing.

Thus the invention provides method and apparatus for ion beam projection lithography which could be used in semiconductor manufacturing with minimum feature sizes of 100 nm or less. Multicusp ion sources with magnetic filters produce uniform plasma volumes larger than 20 cm in diameter. By employing a patterned beamlet switching system, in which each beamlet is individually controlled, as the extractor for the ion source, a beam with a desired feature pattern is produced without requiring a separate mask for each pattern. The beam with selected pattern is then passed through a compact all electrostatic column to demagnify the fature pattern to a desired level.

Changes and modifications in the specifically described embodiments can be carried out without departing from the scope of the invention which is intended to be limited only by the scope of the appended claims.

What is claimed is:

1. A pattern generator for controllably producing a plurality of micro-ion-beamlets from an ion source in a selectable pattern, comprising:
   a first electrode positioned adjacent to the ion source and having a first plurality of apertures formed therein for producing an array of micro-ion-beamlets by passing ions from the ion source therethrough;
   a second electrode in a spaced relation to the first electrode and having a second plurality of apertures formed therein and aligned with the first plurality of apertures, the second electrode electrostatically and individually controlling the passage therethrough of each of the micro-ion-beamlets passing through the first electrode to produce the selectable pattern.

2. The pattern generator of claim 1 wherein first electrode comprises a conductor having the first plurality of apertures formed therein.

3. The pattern generator of claim 2 wherein the second electrode comprises an insulator having the second plurality of apertures formed therein, and a conductive electrode element in each aperture.

4. The pattern generator of claim 3 further comprising a controllable voltage source connected to the first electrode and to each conductive electrode element of the second electrode.

5. A maskless micro-ion-beam reduction lithography (MMRL) system, comprising:
   a plasma generator which produces ions in a plasma generation region;
   a pattern generator positioned adjacent to the plasma generation region of the ion source for electrostatically extracting ions from the plasma generator and producing a controlled selectable pattern of micro-ion-beamlets;
   an acceleration and reduction column following the pattern generator and having aligned apertures therethrough for accelerating and focusing the micro-ion-beamlets extracted from the plasma generation region to produce a demagnified final ion beam with the selected pattern.

6. The MMRL system of claim 5 wherein the plasma generator comprises a multicusp ion source.

7. The MMRL system of claim 6 wherein the plasma generator comprises a multicusp ion source with a coaxial magnetic filter.

8. The MMRL system of claim 5 wherein the pattern generator comprises a two electrode blanking system.

9. The MMRL system of claim 5 further comprising a voltage source connected to the pattern generator for applying voltages to the pattern generator to control individual beamlets.

10. The MMRL system of claim 5 wherein the pattern generator comprises a pair of spaced electrodes having a plurality of apertures therethrough, and a controllable voltage source connected to the two electrodes to electrostatically control the passage of each individual beamlet to form a predetermined beamlet pattern.

11. The MMRL system of claim 5 wherein the pattern generator comprises:
   a first electrode positioned adjacent to the ion source and having a first plurality of apertures formed therein for producing an array of micro-ion beamlets by passing ions from the ion source therethrough;
   a second electrode in a spaced relation to the first electrode and having a second plurality of apertures formed therein and aligned with the first plurality of apertures, the second electrode electrostatically and individually controlling the passage therethrough of each of the micro-ion-beamlets passing through the first electrode.

12. The MMRL system of claim 5 wherein the acceleration and reduction column includes a split electrode Einzel lens for scanning the final ion beam over a workpiece.

13. The MMRL system of claim 5 further comprising a translatable mount for holding a workpiece onto which the final ion beam is directed.

14. The MMRL system of claim 5 wherein the acceleration and reduction column has a demagnification factor of about 5 to about 50.

15. The MMRL system of claim 5 wherein the acceleration and reduction column has a length of about 35 cm to about 65 cm.

16. The MMRL system of claim 5 further comprising a translatable stage positioned after the acceleration and reduction column for mounting a wafer to be processed.

17. A method of producing a focused ion beam comprising a plurality of beamlets in a selectable predetermined pattern, comprising:

generating a plasma;

extracting ions from the plasma through a pattern generator which selectably and controllably produces the predetermined pattern of beamlets;

passing the ions extracted through the pattern generator through aligned apertures in an acceleration and reduction column to produce a demagnified final ion beam with the selectable predetermined pattern.

18. The method of claim 17 further comprising directing the ion beamlets from the acceleration and reduction column onto a resist coated wafer.

19. The method of claim 17 wherein the step of extracting ions through a pattern generator is performed by forming the pattern generator of a pair of electrodes having a plurality of aligned apertures therethrough, and applying control voltages to the electrodes to enable or disable passage of each beamlet.

20. The method of claim 17 wherein the acceleration and reduction column has a demagnification factor of about 5 to about 50.

* * * * *